United States Patent
Sun et al.

(10) Patent No.: US 11,495,436 B2
(45) Date of Patent: Nov. 8, 2022

(54) SYSTEMS AND METHODS TO CONTROL CRITICAL DIMENSION (CD) SHRINK RATIO THROUGH RADIO FREQUENCY (RF) PULSING

(71) Applicant: Tokyo Electron Limited, Tokyo (JP)

(72) Inventors: Junling Sun, Albany, NY (US);
Andrew Metz, Albany, NY (US);
Angelique Raley, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/176,342

(22) Filed: Feb. 16, 2021

(65) Prior Publication Data
US 2021/0343502 A1  Nov. 4, 2021

Related U.S. Application Data

(60) Provisional application No. 63/017,871, filed on Apr. 30, 2020.

(51) Int. Cl.
*H01J 37/32* (2006.01)
*H01L 21/311* (2006.01)

(52) U.S. Cl.
CPC .. *H01J 37/32146* (2013.01); *H01J 37/32174* (2013.01); *H01L 21/31116* (2013.01); *H01L 21/31138* (2013.01); *H01J 2237/332* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 8,354,655 B2 * | 1/2013 | Godet | H01J 37/3023 250/492.23 |
| 9,240,320 B1 | 1/2016 | Subramonium et al. | |
| 9,281,190 B2 | 3/2016 | Chiang et al. | |
| 2007/0119373 A1 | 5/2007 | Kumar et al. | |
| 2008/0038673 A1 * | 2/2008 | Nagaiwa | H01L 21/31122 430/311 |

(Continued)

FOREIGN PATENT DOCUMENTS

| | | |
|---|---|---|
| KR | 20140016201 A | 2/2014 |
| KR | 20140077865 A | 6/2014 |

OTHER PUBLICATIONS

Korean Intellectual Property Office, The International Search Report and Written Opinion for International Application No. PCT/US2021/025912, dated Jul. 26, 2021, 8 pages.

*Primary Examiner* — Allan W. Olsen

(57) ABSTRACT

Systems and methods are provided herein for etch features on a substrate, while maintaining a near-unity critical dimension (CD) shrink ratio. The features etched may include, but are not limited to contacts, vias, etc. More specifically, the techniques described herein use a pulsed plasma to control the polymer build-up ratio between the major CD and minor CD of the feature, and thus, control the CD shrink ratio when etching features having substantially different major and minor dimensions. The CD shrink ratio is controlled by selecting or adjusting one or more operational parameters (e.g., duty cycle, RF power, etch chemistry, etc.) of the plasma etch process(es) to control the amount of polymer build-up at the major and minor dimensions of the feature.

20 Claims, 7 Drawing Sheets

(56) References Cited

U.S. PATENT DOCUMENTS

| | | | |
|---|---|---|---|
| 2009/0107954 A1* | 4/2009 | Feng | H01L 21/31144 |
| | | | 216/51 |
| 2010/0311245 A1* | 12/2010 | Honda | H01L 21/31122 |
| | | | 257/E21.218 |
| 2014/0357080 A1* | 12/2014 | Lisi | H01L 21/31138 |
| | | | 438/717 |
| 2015/0162202 A1* | 6/2015 | Yoshida | H01L 21/32139 |
| | | | 438/710 |
| 2017/0076945 A1 | 3/2017 | Hudson et al. | |
| 2021/0142987 A1* | 5/2021 | Shimizu | H01J 37/32183 |

* cited by examiner

|  | Incoming | Continuous Wave (CW) Plasma | Pulsed Plasma (100W, 40% duty cycle) |
|---|---|---|---|
| Y (ΔY) | 163.65 | 156.39 (-7.26) | 159.87 (-3.78) |
| X (ΔX) | 31.08 | 27.04 (-4.04) | 26.96 (-4.12) |
| ΔY/ΔX | -- | 1.79 | 0.92 |

FIG. 6

|  | Incoming | Pulsed Plasma (100W HF 60% duty cycle, 500W LF) | Pulsed Plasma (100W HF 20% duty cycle, 300W LF) |
|---|---|---|---|
| Y (ΔY) | 163.65 | 149.38 (-14.27) | 146.02 (-17.63) |
| X (ΔX) | 31.08 | 17.91 (-13.17) | 13.93 (-17.15) |
| ΔY/ΔX | -- | 1.08 | 1.03 |

FIG. 7

SYSTEMS AND METHODS TO CONTROL CRITICAL DIMENSION (CD) SHRINK RATIO THROUGH RADIO FREQUENCY (RF) PULSING

PRIORITY CLAIM

This application claims priority to U.S. Provisional Patent Application No. 63/017,871, entitled "Systems and Methods to Control Critical Dimension (CD) Shrink Radio through Radio Frequency (RF) Pulsing," filed Apr. 30, 2020 the disclosure of which is expressly incorporated herein, in its entirety, by reference.

BACKGROUND

The present disclosure relates to the processing of substrates. In particular, it provides a novel system and method for etching layers on substrates. In one embodiment, the system and method disclosed herein may be utilized when processing semiconductor substrates.

The use of plasma systems for the processing of substrates has long been known. For example, plasma etch processing of substrates is well known and has been used to create features on or within substrates, such as contacts, vias, etc. Shrinking critical dimensions (CD) of features (such as, e.g., contacts, vias, etc.) is critical for the fabrication of advanced technology nodes and has been achieved using plasma etch processing. In some conventional plasma etch processes (e.g., continuous wave plasma etch processes), however, the CD shrinkage is non-uniform for features with different major and minor dimensions, such as features having elliptical or rectangular cross-sectional shapes.

FIG. 1A is a top view of a portion of a substrate 100 having a plurality of contacts 105 formed therein. The contacts 105 shown in FIG. 1A have rectangular cross-sectional shapes with substantially different major (Y) and minor (X) dimensions. When etching contacts 105 using continuous wave plasma etch processes, significantly more polymer may be deposited onto the via sidewall arranged along the major (Y) dimension than the minor (X) dimension. This causes the critical dimension (CD) of the subsequently formed contact 105 to shrink more in the major (Y) dimension than the minor (X) dimension, resulting in a non-unity CD shrink ratio ($\Delta Y/\Delta X$).

FIGS. 1B-1D illustrate a conventional process flow for etching contacts 105 using conventional processing techniques. As shown in FIG. 1B, substrate 100 may be a patterned substrate in which one or more layers are formed on a base substrate 110. The base substrate 110 may be a semiconductor substrate having one or more semiconductor processing layers (all of which together may comprise the base substrate) formed thereon. Prior to etching the contacts 105, one or more layers may be formed on the base substrate 110 utilizing any of a wide variety of substrate processing techniques. In the example shown in FIG. 1B, an oxide layer 120, an organic planarization layer (OPL) 130, an anti-reflective coating (ARC) layer 140 and a patterning layer 150 are sequentially formed on the base substrate 110. The oxide layer 120, OPL 130, ARC layer 140 and patterning layer 150 may be formed from a variety of materials commonly used for such purpose utilizing known semiconductor processing steps. Once the patterning layer 150 is formed, the layers shown in FIG. 1B may be etched to form contacts 105, as shown in FIGS. 1C-1D.

As shown in FIG. 1C, a polymer 160 begins to build up on the sidewalls of the contacts 105 when etching contacts using conventional continuous wave (CW) plasma etch processing. In the rectangular-shaped contacts 105 shown in FIGS. 1A-1D, and other contacts and features having substantially different major (Y) and minor (X) dimensions, a significantly larger amount of polymer 160 may be deposited onto the contact sidewalls arranged along the major dimension than those arranged along the minor dimension. This disproportionate polymer build-up causes the critical dimension (CD) of the subsequently formed contact 105 (FIG. 1D) to shrink more in the major (Y) dimension than the minor (X) dimension, resulting in a non-unity CD shrink ratio ($\Delta Y/\Delta X$). This is undesirable in many cases, since it changes the shape of the contact which can ultimately lead to performance problems in the devices being fabricated.

The shrinkage of the major CD is typically more than that of the minor CD, primarily because the major CD has a larger solid angle, and thus, receives significantly more polymer deposition on the sidewall during the etch, as compared to the minor CD. For some technology nodes (e.g., 7 nm nodes and lower), this non-uniform CD shrinkage cannot be resolved by increasing the major (Y) dimension in the patterning layer 150 through photolithographic processes, due to potential bridging in the major dimension.

A need, therefore, remains for an improved plasma etch process that can shrink critical dimensions (CD) of features, while maintaining a near-unity CD shrink ratio.

SUMMARY

Systems and methods are provided herein for etch features on a substrate, while maintaining a near-unity critical dimension (CD) shrink ratio. The features etched may include, but are not limited to contacts, vias, etc. More specifically, the techniques described herein use a pulsed plasma to control the polymer build-up ratio between the major CD and minor CD of the feature, and thus, control the CD shrink ratio when etching features having substantially different major and minor dimensions. The CD shrink ratio is controlled by selecting or adjusting one or more operational parameters (e.g., duty cycle, RF power, etch chemistry, etc.) of the plasma etch process(es) to control the amount of polymer build-up at the major and minor dimensions of the feature.

In one embodiment, a method is provided for etching features on a substrate, the method comprising forming a patterning layer and one or more underlying layers on a substrate and generating a pulsed plasma within a process chamber of a plasma processing system by periodically turning a radio frequency (RF) source on and off according to a duty cycle. The method further comprises using the pulsed plasma to etch portions of the one or more underlying layers exposed by the patterning layer to form features on the substrate. According to the method, the features each have a major critical dimension (CD) and a minor CD, the minor CD differing from the major CD and the pulsed plasma controls a CD shrink ratio of the major CD and the minor CD associated with the features by controlling polymer build-up on the features.

In some embodiments of the method, the features comprise contacts or vias. In some embodiments, the RF source provides modulated source power in a high-frequency range to an electrode disposed within the process chamber. In certain embodiments, the pulsed plasma controls the polymer build-up on the major CD. In some embodiments, the high-frequency range comprises 3 MHz to 150 MHz.

According to some embodiments of the method, the RF source provides modulated bias power in a low-frequency range to an electrode disposed within the process chamber. In certain embodiments, the low-frequency range comprises 0.2 MHz to 60 MHz. In some embodiments, generating the pulsed plasma comprises providing modulated power to a first electrode disposed within the process chamber by periodically turning the RF source on and off according to the duty cycle, and providing continuous wave (CW) power to a second electrode disposed within the process chamber while providing the modulated power to the first electrode. In other embodiments, the method further comprises selecting or adjusting one or more operational parameters of the plasma processing system to control the polymer build-up on the major CD. In another embodiment, the one or more operational parameters include at least one of: the duty cycle of the RF source, a power or voltage of the RF source and an etch chemistry supplied to the process chamber to generate the pulsed plasma. In some embodiments, the selecting or adjusting the one or more operational parameters of the plasma processing system comprises increasing the duty cycle of the RF source to increase polymer deposition, and/or decreasing the duty cycle of the RF source to increase sputtering and remove the polymer deposition. In some embodiments, the duty cycle is between 20% and 60%.

Another embodiment provides a method for controlling a critical dimension (CD) shrink ratio associated with features formed on a substrate, the method comprising forming a patterning layer and one or more underlying layers on the substrate and generating a pulsed plasma within a process chamber of a plasma processing system by modulating a source power provided by a high-frequency radio frequency (RF) source to a first electrode disposed within the process chamber according to a duty cycle. This method further comprises using the pulsed plasma to etch portions of the one or more underlying layers exposed by the patterning layer to form the features on the substrate, wherein the features each have a major CD and a minor CD, the minor CD differing from the major CD and controlling the CD shrink ratio associated with the features by selecting or adjusting one or more operational parameters of the plasma processing system to control polymer deposition that occurs on the major CD when etching the portions of the one or more underlying layers.

In another embodiment, the generating the pulsed plasma comprises modulating the source power provided to the first electrode by periodically turning the high-frequency RF source on and off according to the duty cycle, and providing continuous wave (CW) power to a second electrode disposed within the process chamber while the modulated source power is provided to the first electrode. Further, generating the pulsed plasma may comprise modulating the source power provided to the first electrode by periodically turning the high-frequency RF source on and off according to the duty cycle and controlling the CD shrink ratio associated with the features by adjusting the duty cycle. The one or more operational parameters may include at least one of: a duty cycle of the high-frequency RF source, a power or voltage of the high-frequency RF source and an etch chemistry supplied to the process chamber to generate the pulsed plasma. The feature of the method may be a contact, wherein the one or more operational parameters is the duty cycle of the high-frequency RF source, and wherein the duty cycle of the plasma processing system are selected or adjusted to provide the CD shrink ratio between 0.9 and 1.1.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIG. 6 is a table comparing major (Y) CDs, minor (X) CDs and CD shrink ratios ($\Delta Y/\Delta X$) obtained after etching a layer (e.g., ARC layer 340) using a conventional continuous wave (CW) plasma etch process and the pulsed plasma etch process techniques disclosed herein.

FIG. 7 is a table comparing major (Y) CDs, minor (X) CDs and CD shrink ratios ($\Delta Y/\Delta X$) obtained after etching one or more underlying layers (e.g., OPL 330 and oxide layer 320) using the pulsed plasma etch process techniques disclosed herein.

DETAILED DESCRIPTION

Systems and methods are provided herein for etch features on a substrate, while maintaining a near-unity critical dimension (CD) shrink ratio. The features etched may include, but are not limited to contacts, vias, etc. More specifically, the techniques described herein use a pulsed plasma to control the polymer build-up ratio between the major CD and minor CD of the feature, and thus, control the CD shrink ratio when etching features having substantially different major and minor dimensions. The CD shrink ratio is controlled by selecting or adjusting one or more operational parameters (e.g., duty cycle, RF power, etch chemistry, etc.) of the plasma etch process(es) to control the amount of polymer build-up at the major and minor dimensions of the feature.

Figure 2:
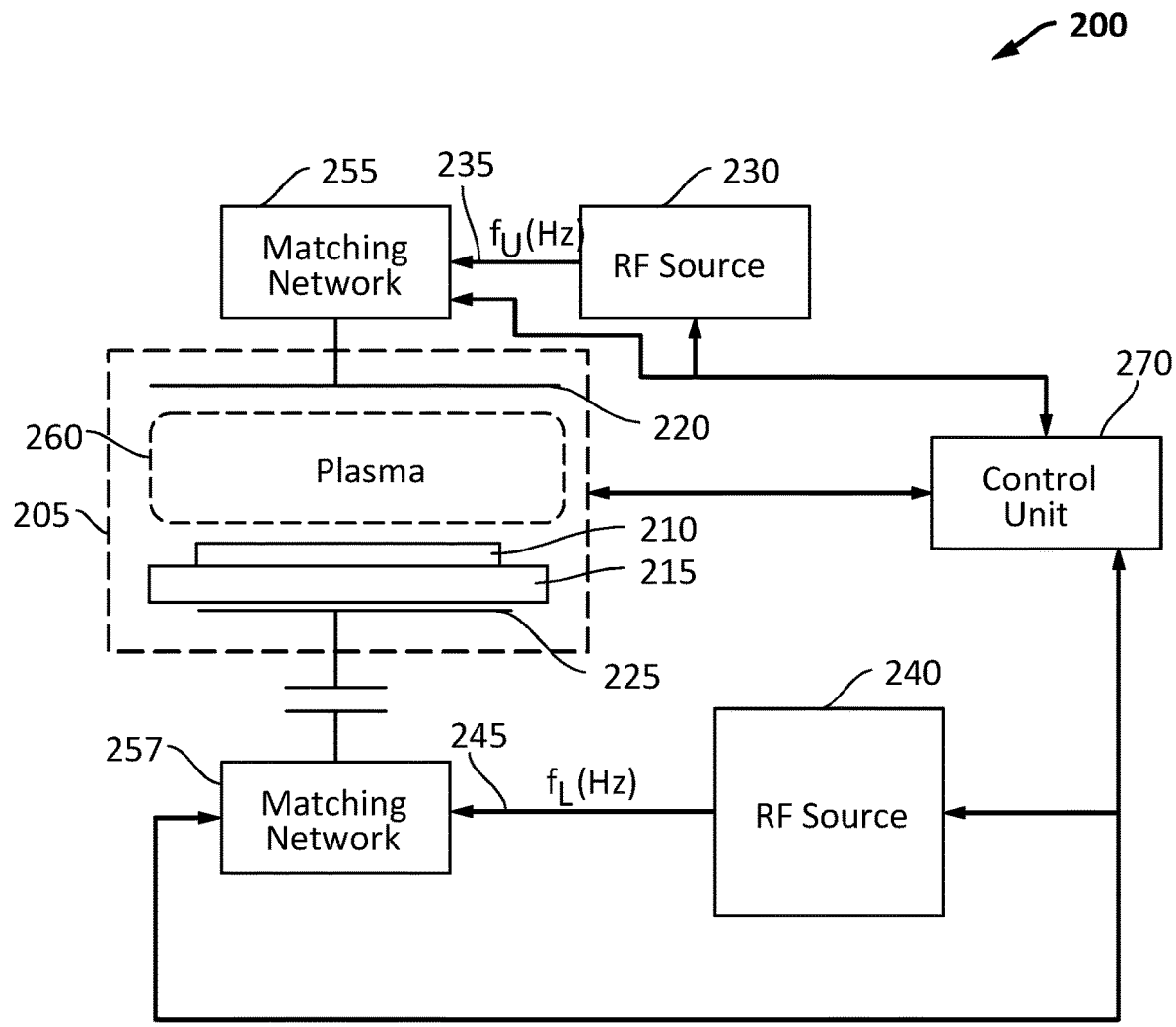
FIG. 2 is a block diagram illustrating one embodiment of a plasma processing system that may be used to etch contacts, and other features having substantially different major and minor dimensions, using the pulsed plasma etch process techniques described herein.

FIG. 2 provides one example embodiment for a plasma processing system 200 that can be used with respect to the disclosed techniques and is provided only for illustrative purposes. The plasma processing system 200 may be a capacitively coupled plasma processing apparatus, inductively coupled plasma processing apparatus, microwave plasma processing apparatus, Radial Line Slot Antenna (RLSA™) microwave plasma processing apparatus, electron cyclotron resonance (ECR) plasma processing apparatus, or other type of processing system or combination of systems. Thus, it will be recognized by those skilled in the art that the techniques described herein may be utilized with any of a wide variety of plasma processing systems.

The plasma processing system 200 can be used for a wide variety of operations including, but not limited to, etching, deposition, cleaning, plasma polymerization, plasma-enhanced chemical vapor deposition (PECVD), atomic layer deposition (ALD), atomic layer etch (ALE), and so forth. The structure of a plasma processing system 200 is well known, and the particular structure provided herein is merely of illustrative purposes. It will be recognized that different and/or additional plasma process systems may be implemented while still taking advantage of the techniques described herein.

Looking in more detail to FIG. 2, the plasma processing system 200 may include a process chamber 205. As is known in the art, process chamber 205 may be a pressure controlled chamber. A substrate 210 (in one example a semiconductor wafer) may be held on a stage or chuck 215. An upper electrode 220 and a lower electrode 225 may be provided as shown. The upper electrode 220 may be electrically coupled to a first radio frequency (RF) source 230 through a first matching network 255. The first RF source 230 may provide a source voltage 235 at an upper frequency ($f_U$). The lower electrode 225 may be electrically coupled to a second RF source 240 through a second matching network 257. The second RF source 240 may provide a bias voltage 245 at a lower frequency ($f_L$). Though not shown, it will be known by those skilled in the art that a voltage may also be applied to the chuck 215.

Components of the plasma processing system 200 can be connected to, and controlled by, a control unit 270 that in turn can be connected to a corresponding memory storage unit and user interface (all not shown). Various plasma processing operations can be executed via the user interface, and various plasma processing recipes and operations can be stored in a storage unit. Accordingly, a given substrate can be processed within the plasma processing chamber with various microfabrication techniques. It will be recognized that control unit 270 may be coupled to various components of the plasma processing system 200 to receive inputs from and provide outputs to the components.

The control unit 270 can be implemented in a wide variety of manners. For example, the control unit 270 may be a computer. In another example, the control unit may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality of a proscribed plasma process recipe. It is further noted that the software or other programming instructions can be stored in one or more non-transitory computer-readable mediums (e.g., memory storage devices, FLASH memory, dynamic random access (DRAM) memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

In operation, the plasma processing system 200 uses the upper and lower electrodes to generate a plasma 260 in the process chamber 205 when applying power to the system from the first RF source 230 and the second RF source 240. Further, as is known in the art, ions generated in the plasma 260 may be attracted to the substrate 210. The generated plasma can be used for processing a target substrate (such as substrate 210 or any material to be processed) in various types of treatments such as, but not limited to, plasma etching, deposition and/or sputtering.

Application of power results in a high-frequency electric field being generated between the upper electrode 220 and the lower electrode 225. Processing gas delivered to process chamber 205 can then be dissociated and converted into a plasma. As shown in FIG. 2, the exemplary plasma processing system 200 described herein utilizes two RF sources. In an exemplary embodiment, the first RF source 230 provides source power at relatively high frequencies to convert the processing gas(es) delivered into the process chamber 205 into plasma and to control the plasma density. The second RF source 240 provides a bias power at lower frequencies to control ion bombardment energy.

In one example plasma processing system, for example, the first RF source 230 may provide about 0 to 1400 W of source power in a high-frequency (HF) range from about 3 MHz to 150 MHz (or above) to the upper electrode 220, and the second RF source 240 may provide about 0 to 1400 W of bias power in a low-frequency (LF) range from about 0.2 MHz to 60 MHz to the lower electrode 225. Different operational ranges can also be used depending on type of plasma processing system and the type of treatments (e.g., etching, deposition, sputtering, etc.) performed therein.

As known in the art, the source power and the bias power may be applied continuously to generate continuous wave (CW) plasmas, or may be pulsed to generate pulsed plasmas within the process chamber 205. To generate pulsed plasmas, the source power and/or the bias power is modulated in time by turning the first RF source 230 and/or the second RF source 240 "on" and "off" during a pulse period. The duty cycle, or duty ratio, is the fraction of the pulse period during which the source/bias power is turned "on." For example, if the source/bias power is turned "on" for time $t_{ON}$ and "off" for time $t_{OFF}$, the pulse period is $t_P = t_{ON} + t_{OFF}$, and the duty cycle is $D = t_{ON}/t_P$.

A variety of modulation schemes may be used to generate pulsed plasmas. For example, pulsed plasmas may be generated by: (a) modulating the source power from the first RF source 230 (source pulsing) while the second RF source 240 provides CW bias power, (b) modulating the bias power from the second RF source 240 (bias pulsing) while the first RF source 230 provides CW source power, or (c) modulating both the source power and the bias power without a phase shift between the two (synchronous pulsing).

As noted above, shrinking critical dimensions (CDs) of features is critical for the fabrication of some advanced technology nodes, particularly for example at nodes of 10 nm and below). Unfortunately, conventional continuous wave (CW) plasma etch processes cause non-uniform CD shrinkage when etching features (e.g., contacts, vias, etc.) having significantly different major and minor dimensions, such as features having elliptical or rectangular cross-sectional shapes.

Figure 1A:
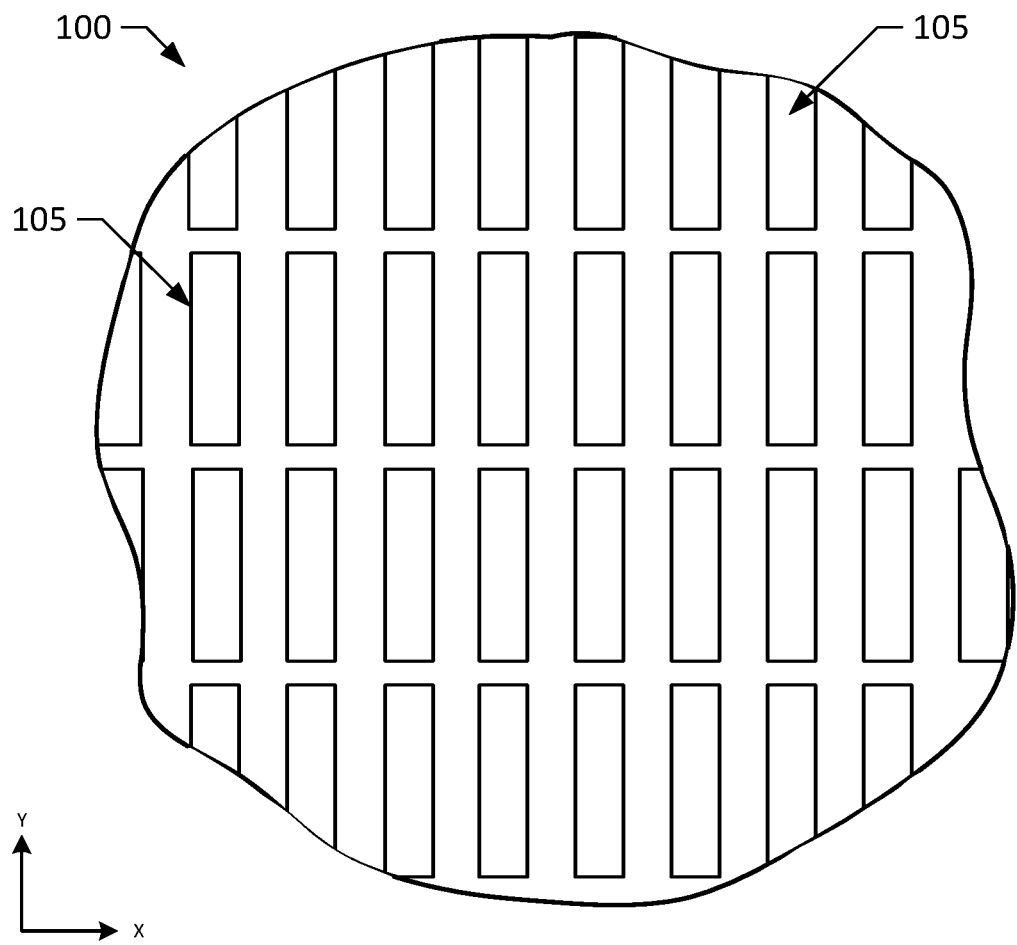
FIG. 1A is a top view illustrating a portion of a prior art substrate having a plurality of contacts formed therein.
Figure 1B:
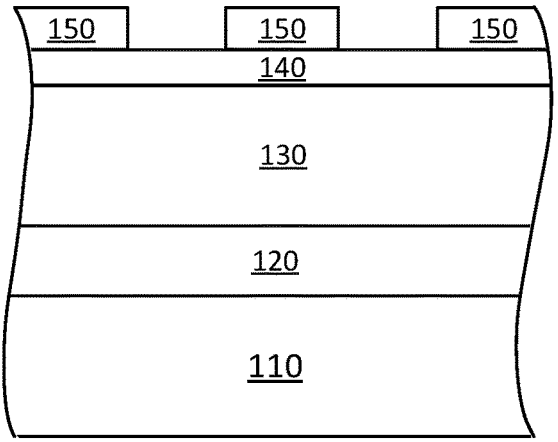
FIGS. 1B-1D illustrate a prior at conventional process flow for etching contacts using conventional processing techniques.
Figure 1C:
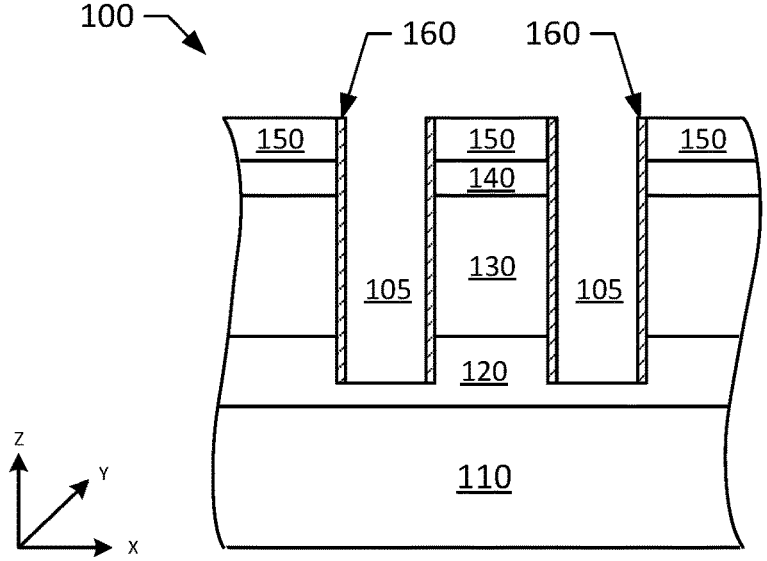
Figure 1D:
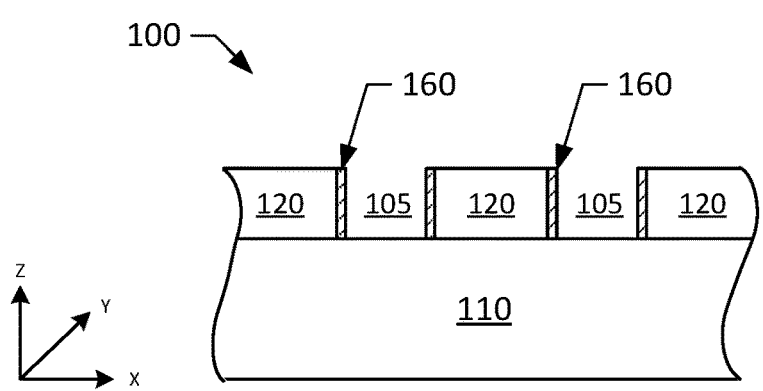

As mentioned above, FIG. 1A illustrates one example of rectangular-shaped contacts 105 having substantially different major (Y) and minor (X) dimensions. When using CW plasma etch processes to etch the rectangular-shaped contacts 105 shown in FIG. 1A, and other features having substantially different major and minor dimensions, more polymer 160 (see, FIGS. 1C and 1D) is deposited onto the feature sidewalls arranged along the major (Y) dimension than those arranged along the minor (X) dimension. This disproportionate polymer build-up causes the critical dimension (CD) of the subsequently formed feature (e.g., contacts 105 of FIG. 1D) to shrink more in the major (Y) dimension than in the minor (X) dimension (i.e., non-uniform CD shrinkage), resulting in a non-unity CD shrink ratio (i.e., a CD shrink ratio, $\Delta Y/\Delta X$, which is not equal to 1). This is undesirable in many cases, since it changes the shape of the feature and can impact performance characteristics of the structures being fabricated.

Embodiments of improved plasma etch processes and methods are provided herein to shrink critical dimensions (CDs) of features, while maintaining a near-unity CD shrink ratio (i.e., a CD shrink ratio substantially equal to 1). In the disclosed embodiments, a pulsed plasma is generated and used to control CD shrinkage when etching features (e.g., contacts, vias, etc.) having substantially different major and minor dimensions. More specifically, a pulsed plasma is generated and used herein to control the amount of polymer (e.g., polymer 160 of FIGS. 1C and 1D) that tends to build up disproportionately on the major CD when etching features using CW plasma etch processes. As described in more detail below, operational parameters (e.g., duty cycle, RF power, etch chemistry, etc.) of the plasma processing system 200 shown in FIG. 2 (or another plasma processing system) may be tuned to control the amount of polymer build-up on the major CD, and thus, control the CD shrink ratio.

In some embodiments, the improved plasma etch processes and methods disclosed herein may use high-frequency, source pulsing techniques to control polymer build-up on the major CD, and thus, control the CD shrink ratio. In this mode, the high-frequency RF source 230 is turned "on" and "off" periodically, while the low-frequency RF source 240 provides CW bias power. When the high-frequency RF source 230 is "on," the plasma generated in the process chamber 205 is radical rich and tends to deposit polymer on the sidewalls of the feature. Since the major CD of some features (e.g., contacts, vias, etc.) has a larger solid angle than the minor CD, the major CD receives more polymer deposition on its sidewall, and thus, more CD shrinkage than the minor CD. When the high-frequency RF source 230 is "off," the plasma generated in the process chamber 205 is dominated with ions, which sputter the feature sidewalls to partially remove the polymer deposition formed during the HF on time. Again, because of the different solid angles of the major and minor CD, the major CD receives more sputter on its sidewall, and as a result, more sidewall polymer deposition is removed from the major CD than the minor CD. By tuning operational parameters (e.g., duty cycle, RF power/voltage, etch chemistry, etc.) of the plasma processing system, the amount of polymer deposited and removed from the major CD can be precisely controlled to thereby control the CD shrink ratio. In one embodiment, increasing or decreasing the duty cycle is utilized to CD shrinkage ratio.

It is recognized that the improved plasma etch processes and methods disclosed herein are not strictly limited to pulsed plasmas generated using high-frequency, source pulsing techniques. In other embodiments, pulsed plasmas may be generated by modulating the bias power from the second RF source 240 (low frequency, bias pulsing) while the first RF source 230 provides CW source power, or by modulating the source power from the first RF source 230 and the bias power from the second RF source 240 at the same time (synchronous pulsing). Although high-frequency, source pulsing techniques are shown herein to suppress major CD shrinkage and achieve near-unity CD shrink ratios when etching features having substantially different major (Y) and minor (X) dimensions (see, e.g., FIGS. 5 and 6), low-frequency, bias pulsing and/or synchronous pulsing may also be used to achieve desired results in accordance with the techniques described herein.

FIGS. 3A-D illustrate one embodiment of an improved plasma etch process flow for etching features (e.g., contacts, vias, etc.) having substantially different major and minor dimensions using the techniques described herein. In the embodiments shown FIGS. 3A-D, contacts 305 are formed within a substrate 300 using a variety of pulsed plasma techniques (e.g., plasma etching, deposition and/or sputtering), some or all of which may be performed within a plasma processing system, such as but not limited to the plasma processing system 200 shown in FIG. 2 and described above.

Prior to performing the techniques described herein, one or more layers used to form the contacts 305 may be provided on a base substrate 310 utilizing any of a wide variety of substrate processing techniques to achieve the structure shown. The base substrates 310 utilized with the techniques disclosed herein may be any substrates for which the etching of material is desirable. For example, in one embodiment, the base substrate 310 may be a semiconductor substrate having one or more semiconductor processing layers (all of which together may comprise the substrate) formed thereon. In one embodiment, the base substrate 310 may be a substrate that has been subject to multiple semiconductor processing steps which yield a wide variety of structures and layers, all of which are known in the substrate processing art. In one embodiment, the base substrate 310 may be a semiconductor wafer including various structures and layers formed.

Figure 3A:
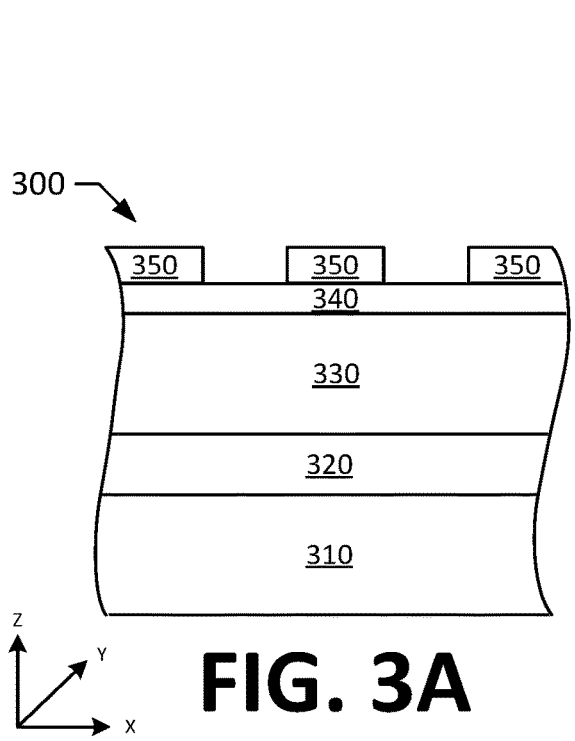
FIG. 3A-3D illustrate one embodiment of an improved process flow for etching contacts, and other features having substantially different major and minor dimensions, using the techniques described herein.
Figure 3B:
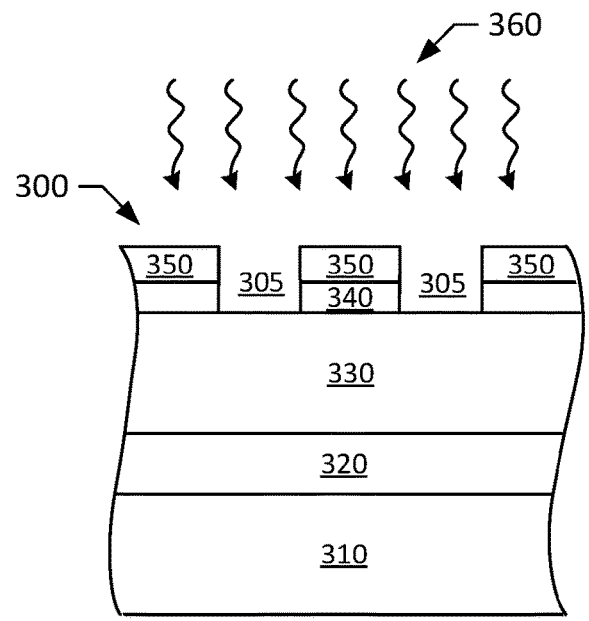
Figure 3C:
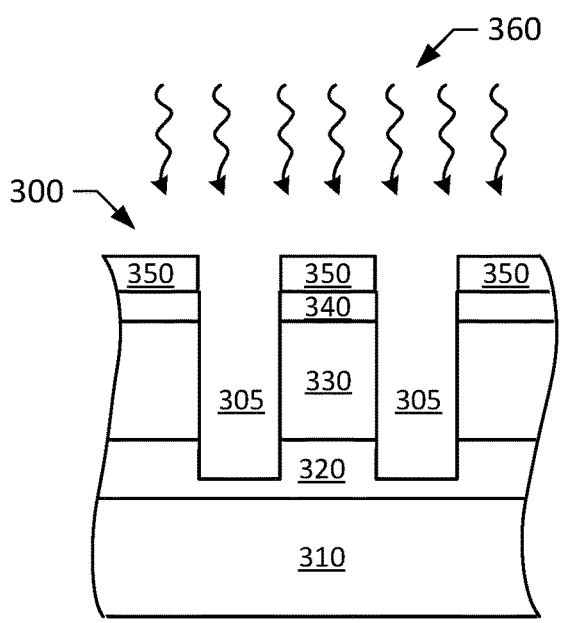
Figure 3D:
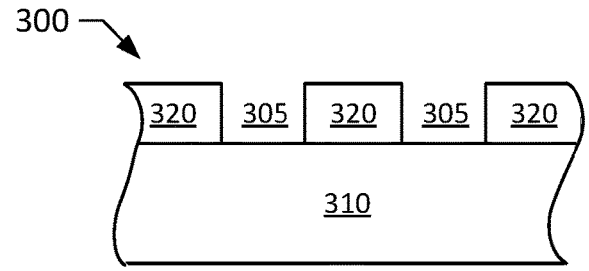

As shown in FIG. 3A, one or more layers may be formed on the base substrate 310 prior to etching the contacts 305. The one or more layers may be formed on the base substrate 310 utilizing any of a wide variety of substrate processing techniques. In the example shown in FIG. 3A, an oxide layer 320 (the target layer within which the contact regions are to be formed), an organic planarization layer (OPL) 330, an anti-reflective coating (ARC) layer 340 and a patterning layer 350 are sequentially formed on the base substrate 310. The oxide layer 320, OPL 330, ARC layer 340 and patterning layer 350 may be formed from a variety of materials commonly used for such purpose utilizing known semiconductor processing steps. For example, oxide layer 320 may include, but is not limited to, silicon oxide. Alternatively, other dielectric layers may be used rather than an oxide layer. For example, a wide range of low dielectric constant (low-k) materials may be utilized. OPL 330 may include, but is not limited to, spin-on-carbon, amorphous carbon layers or other materials. ARC layer 340 may include, but is not limited to, a silicon ARC layer, oxynitride layers, etc. The patterning layer 350 may be a patterned photo resist layer, a patterned hard mask layer or another patterned layer. Once the patterning layer 350 is formed, the layers shown in FIG. 3A may be etched to form contacts 305, as shown in FIGS. 3B-3D. It will be recognized by those skilled in the art that the materials and layers described herein are merely exemplary. Thus, the techniques described herein to adjust the shrinkage of the minor and major axis of a feature such as a contact may be used with any of a wide range of differing materials and layers and those materials and layers shown herein are merely provided for illustrative purposes.

The etch process used to form the contacts 305 may be implemented as one or more plasma etch process steps using one or more plasma etch chemistries. In addition, the etch process may be performed in one or more plasma processing systems or tools. In one exemplary preferred embodiment, the etch of the contacts 305 is performed in a plasma processing system having at least one RF source. It will be recognized that a wide range of plasma processing systems or tools may be used to etch the contacts 305. For example, the plasma processing system may be an inductively coupled plasma (ICP) etch tool, a capacitively coupled plasma (CCP) etch tool, a microwave plasma etch tool, or other etch tools.

In FIGS. 3B-3D, contacts 305 are formed by etching portions of the ARC layer 340, OPL 330 and oxide layer 320 exposed by the patterning layer 350. As noted above, the contacts 305 may be etched in one or more plasma etch process steps using one or more plasma etch chemistries. In one example, the etch utilized to etch the contacts 305 may include multiple etch steps. Exemplary etch chemistries may include utilizing $CF_4$, $C_4F_8$, $O_2$, and Ar chemistries for etching the ARC layer 340, $N_2$ and $H_2$ chemistries for etching the OPL 330, and $CF_4$, $O_2$, and Ar chemistries for etching the oxide layer 320.

During the etch process shown in FIGS. 3B-3D, processing gas delivered to the process chamber interacts with an electric field generated between the upper and lower electrodes to generate a plasma 360. As noted above and shown in FIG. 2, the electric field may be generated by supplying power from one or more RF sources to one or more electrodes disposed within the process chamber. For example, a first RF source 230 may provide source power at relatively high frequencies to an upper electrode 220, and a second RF source 240 may provide bias power at lower frequencies to a lower electrode 225 (or vice versa).

In the present disclosure, the electric field generated between the upper and lower electrodes may be modulated in time to generate a pulsed plasma 360. In one exemplary preferred embodiment, the high-frequency RF source 230 is periodically turned "on" and "off" to provide modulated or pulsed source power, while the low-frequency RF source 240 provides CW bias power. When the high-frequency RF source 230 is "on," the pulsed plasma 360 is radical rich and tends to deposit polymer on the sidewalls of the contacts 305. When the high-frequency RF source 230 is "off," the pulsed plasma 360 is dominated with ions, which sputter the sidewalls of the contacts 305 to remove at least a portion of the polymer deposited during the high-frequency on time. By using a pulsed plasma 360 to form contacts 305, the present disclosure controls polymer build-up on the major CD, and thus, controls the CD shrink ratio of the contacts 305.

As noted above, operational parameters (e.g., duty cycle, RF power/voltage, etch chemistry, etc.) of the plasma etch process(es) may be tuned to control the amount of polymer build-up on the major CD, and thus, control the CD shrink ratio of the contacts 305. In some embodiments, the duty cycle of the high-frequency RF source 230 may be selected or adjusted to control polymer build-up on the major CD of the contacts 305. For example, the duty cycle may be increased to increase polymer build up, or may be decreased to increase sputtering and remove more polymer build-up from the contact sidewalls arranged along the major dimension. In one exemplary preferred embodiment, the duty cycle of the high-frequency RF source 230 may be selected from a range consisting of 10% duty cycle to 90% duty cycle. In a more particular example, the duty cycle may be chosen between 10% and 70% and even more particularly between 20% and 60%.

Other operational parameters of the plasma etch process (es) may also be tuned to control the amount of polymer build-up on the major CD of the contacts 305. In some embodiments, the bias power of the LF may be selected or adjusted to control polymer build-up on the major CD of the contacts 305. For example in one embodiment, the LF bias power may vary between 300 W to 700 W, with higher power generally removing more polymer build-up as compared to lower bias power. In some embodiments, the etch chemistry used during one or more of the plasma etch process steps may be selected or adjusted to control polymer build-up on the major CD of the contacts 305. For example, the ratio increase of $C_4F_8$ or $C_4F_6$ to $CF_4$ increases the polymer build-up.

As noted above, one or more plasma etch process steps may be used to form the contacts 305. In some embodiments, different operational parameters may be used when multiple etch process steps are utilized to form the contacts 305. In one embodiment, the ARC layer 340 may be etched in a first plasma etch process using a first set of operational parameters, and the underlying layers (e.g., OPL 330 and oxide layer 220) may be etched in a second plasma etch process using a second set of operational parameters. In one example implementation, the ARC layer 340 may be etched using 100 W of source power at 40% duty cycle, and the underlying layers may be etched using, for example, 500 W of source power at 20% duty cycle or 300 W of source power at 60% duty cycle. Results of such etch processes are shown in FIGS. 6 and 7 and discussed below. Alternative duty cycles and RF power/voltage settings may also be used.

Figure 4:
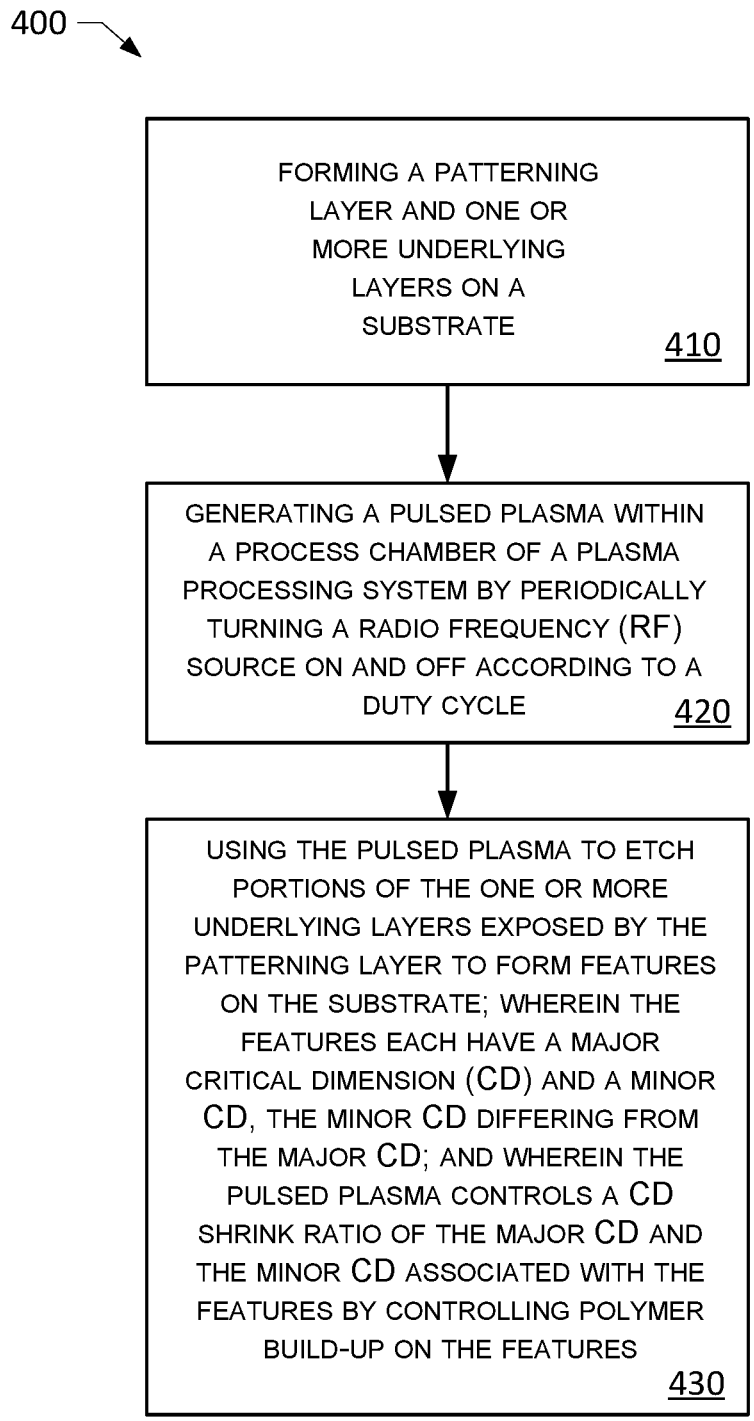
FIG. 4 is a flowchart diagram illustrating one embodiment of a method to form features having substantially different major and minor dimensions using the pulsed plasma etch process techniques disclosed herein.
Figure 5:
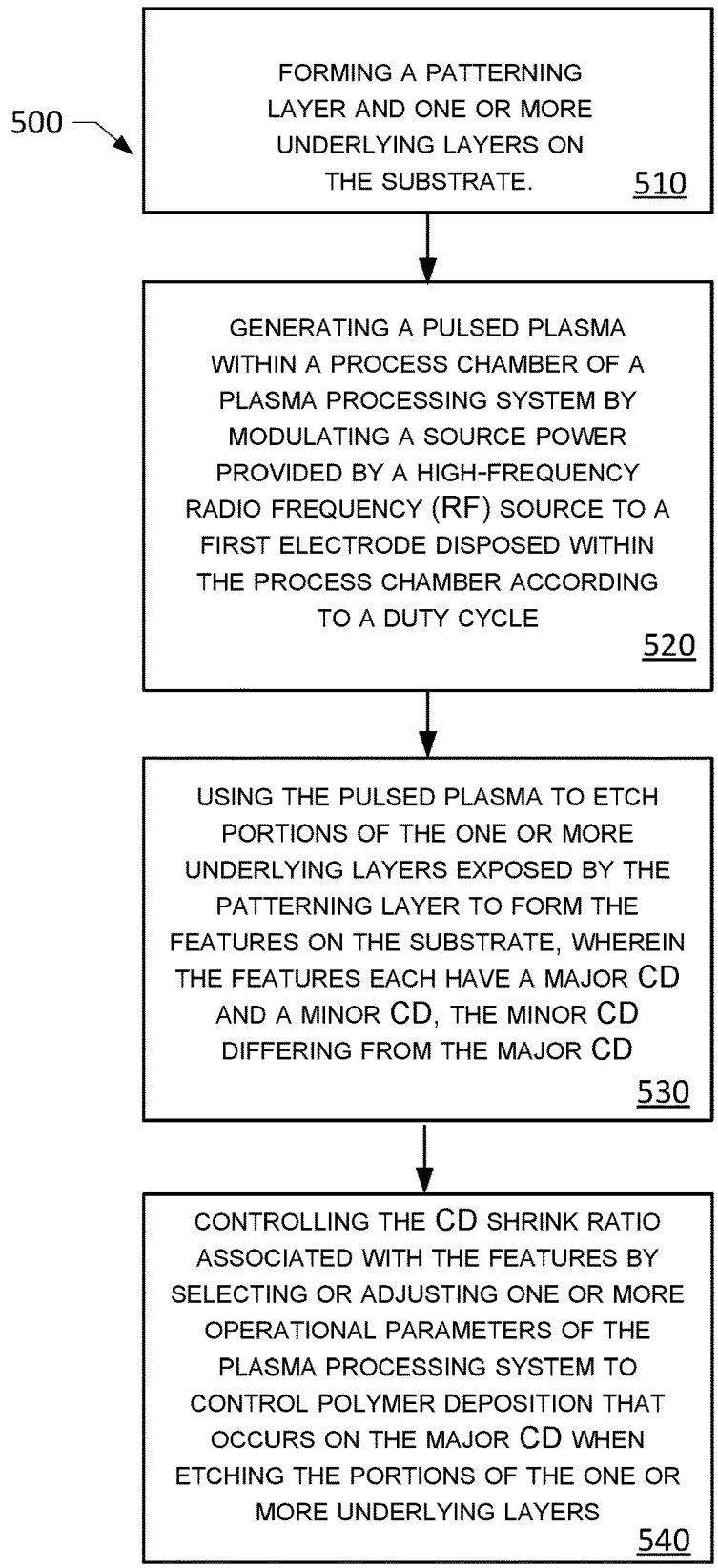
FIG. 5 is a flowchart diagram illustrating one embodiment of a method to control a critical dimension (CD) shrink ratio associated with features formed on a substrate using the pulsed plasma etch process techniques disclosed herein.

FIGS. 4-5 illustrate exemplary methods for use of the processing techniques described herein. It will be recognized that the embodiments of FIGS. 4-5 are merely exemplary and additional methods may utilize the techniques described herein. Further, additional processing steps may be added to the methods shown in the FIGS. 4-5 as the steps described are not intended to be exclusive. Moreover, the order of the steps is not limited to the order shown in the figures as different orders may occur and/or various steps may be performed in combination or at the same time.

FIG. 4 illustrates one embodiment of a method 400 that may be used to form features having substantially different major and minor dimensions using the techniques disclosed herein. In some embodiments, the method 400 is a method comprising a step 410 of forming a patterning layer and one or more underlying layers on a substrate; and a step 420 of generating a pulsed plasma within a process chamber of a plasma processing system by periodically turning a radio frequency (RF) source on and off according to a duty cycle. Further, the method 400 comprises a step 430 of using the pulsed plasma to etch portions of the one or more underlying layers exposed by the patterning layer to form features on the substrate; wherein the features each have a major critical dimension (CD) and a minor CD, the minor CD differing from the major CD; and wherein the pulsed plasma controls a CD shrink ratio of the major CD and the minor CD associated with the features by controlling polymer build-up on the features.

FIG. 5 illustrates one embodiment of a method 500 that may be a method for controlling a critical dimension (CD) shrink ratio associated with features formed on a substrate using the techniques disclosed herein. The method 500 may be a method comprising a step 510 of forming a patterning layer and one or more underlying layers on the substrate. Further the method comprises a step 520 of generating a pulsed plasma within a process chamber of a plasma processing system by modulating a source power provided by a high-frequency radio frequency (RF) source to a first electrode disposed within the process chamber according to a duty cycle. The method further comprises a step 530 of using the pulsed plasma to etch portions of the one or more underlying layers exposed by the patterning layer to form the features on the substrate, wherein the features each have a major CD and a minor CD, the minor CD differing from the major CD. Finally, the method comprises as step 540 of controlling the CD shrink ratio associated with the features by selecting or adjusting one or more operational parameters of the plasma processing system to control polymer deposition that occurs on the major CD when etching the portions of the one or more underlying layers.

The tables shown in FIGS. 6 and 7 demonstrate exemplary results of the techniques described herein. In FIGS. 6 and 7, major (Y) and minor (X) CDs of a feature (e.g., a contact, via, etc.) having substantially different major and minor dimensions are measured before etching ("Incoming") and after etching using a conventional continuous wave (CW) plasma etch process (FIG. 6 only) and after etching using the pulsed plasma etch techniques described herein (FIGS. 6 and 7). In the example shown in FIGS. 6 and 7, the major (Y) CD of the feature is 163.65 nm and the minor (X) CD is 31.08 nm before etching is performed.

In the table shown in FIG. 6, the major (Y) and minor (X) CDs are measured after the ARC layer 340 shown in FIG. 3B is etched using a conventional CW plasma etch process and the pulsed plasma etch process techniques herein. For the conventional CW plasma etch process, the major CD shrink ($\Delta Y=-7.26$) is more than the minor CD shrink ($\Delta X=-4.04$), which gives a CD shrink ratio ($\Delta Y/\Delta X$) of 1.79. In contrast, when a pulsed plasma etch process (e.g., HF power 100 W, 40% duty cycle) is used in accordance with the techniques described herein, the major CD shrink ($\Delta Y=-3.8$) is less than the minor CD shrink ($\Delta X=4.12$), resulting in a near-unity CD shrink ratio ($\Delta Y/\Delta X$) of 0.92. This result indicates that pulsed plasmas generated via high-frequency source pulsing sufficiently suppress the major CD shrink, a phenomenon which cannot be achieved using conventional CW plasma etch processes.

In the table shown in FIG. 7, the major (Y) and minor (X) CDs are measured after the pulsed plasma etch process techniques described herein are used to complete etching of the contacts 305, as shown in FIG. 3D. Two different sets of operational parameters are illustrated in FIG. 7. In the first set, a CD shrink ratio ($\Delta Y/\Delta X$) of 1.08 is obtained when etching layers underlying ARC layer 340 (e.g., OPL 330 and oxide layer 320) using a pulsed plasma generated, for example, by modulating a 100 W HF source power at 60% duty cycle and using 500 W LF bias power. In the second set, a CD shrink ratio ($\Delta Y/\Delta X$) of 1.03 is obtained when etching the underlying layers using a pulsed plasma generated by modulating a 100 W HF source power at 20% duty cycle and using 300 W LF bias power. Thus, FIG. 7 demonstrates how different operating parameters can be selected to maintain a near-unity CD shrink ratio when etching features using the pulsed plasma etch process techniques herein. In a preferred embodiment the CD shrink ration is between 0.8 and 1.2, more preferable between 0.9 and 1.1, and even more preferable between 0.95 and 1.05.

The results shown in FIGS. 6 and 7 show high-frequency, source pulsing effectively controls polymer build-up on the major CD of features having substantially different major (Y) and minor (X) dimensions, and thus, can be used to control the CD shrink ratio ($\Delta Y/\Delta X$) of such features. In particular, the results shown in FIGS. 6 and 7 show that high-frequency, source pulsing can be used to maintain a near-unity CD shrink ratio (e.g., a CD shrink ratio substantially equal to 1), which is difficult (if not impossible) to obtain through conventional CW plasma etch processes.

The techniques described herein to shrink critical dimensions (CDs) of features, while maintaining a near-unity CD shrink ratio. More specifically, the techniques described herein use a pulsed plasma to control polymer build-up on the major CD, and thus, control the CD shrink ratio when etching features having substantially different major and minor dimensions. Unlike the conventional process flow shown in FIGS. 1A-1D, a near-unity CD shrink ratio is maintained in the process flow shown in FIGS. 3A-3D and the methods shown in FIGS. 4 and 5 by selecting or adjusting one or more operational parameters (e.g., duty cycle, RF power, etch chemistry, etc.) of the plasma etch process(es) to control the amount of polymer build-up on the major CD.

It is noted that the techniques described herein may be utilized within a wide range of plasma processing systems. Although a particular plasma processing system 200 is shown in FIG. 2, it will be recognized that the techniques described herein may be utilized within other plasma processing systems. In one example system, the RF sources shown in FIG. 2 may be switched (e.g., higher frequencies may be supplied to the lower electrode 225 and lower frequencies may be supplied to the upper electrode 220). Further, a dual source system is shown in FIG. 2 merely as an example system. It will be recognized that the techniques described herein may be utilized with other plasma processing systems in which a modulated RF power source is provided to one or more electrodes, direct current (DC) bias sources are utilized, or other system components are utilized.

It is noted that various deposition processes can be used to form one or more of the material layers shown and described herein. For example, one or more depositions can be implemented using chemical vapor deposition (CVD), plasma enhanced CVD (PECVD), physical vapor deposition (PVD), atomic layer deposition (ALD), and/or other deposition processes. In one example plasma deposition process, a precursor gas mixture can be used including but not limited to silicon containing gases, hydrocarbons, fluorocarbons, or nitrogen containing hydrocarbons in combination with one or more dilution gases (e.g., argon, nitrogen, etc.) at a variety of pressure, power, flow and temperature conditions.

It is further noted that various etch processes can be used to etch one or more of the material layers shown and described herein. For example, one or more etch processes can be implemented using plasma etch processes, discharge etch processes, and/or other desired etch processes. The plasma etch processes described herein can be implemented using plasma containing fluorocarbons, oxygen, nitrogen, hydrogen, argon, and/or other gases. As noted above, operational parameters (e.g., duty cycle, RF power, etch chemistry, etc.) of one or more plasma etch processes described herein may be tuned to control the amount of polymer deposited on and removed from the major CD of an etched feature, and thus, to control the CD shrink ratio of the etched feature.

Other operating variables for process steps can also be adjusted to control the various deposition and/or etch processes described herein. The operating variables may include, for example, the chamber temperature, chamber pressure, flowrates of gases, types of gases, and/or other operating variables for the processing steps. Variations can also be implemented while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a substrate are described in various embodiments. The substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method, comprising:
    forming a patterning layer and one or more underlying layers on a substrate;
    generating a pulsed plasma within a process chamber of a plasma processing system by periodically turning a radio frequency (RF) source on and off according to a duty cycle;
    using the pulsed plasma to etch portions of the one or more underlying layers exposed by the patterning layer to form features on the substrate;
    wherein the features each have a major critical dimension (CD) and a minor CD, the minor CD differing from the major CD; and
    wherein the pulsed plasma controls a CD shrink ratio of the major CD and the minor CD associated with the features by controlling polymer build-up on the features.

2. The method of claim 1, wherein the features comprise contacts or vias.

3. The method of claim 1, wherein the RF source provides modulated source power in a high-frequency range of 3 MHz or higher to an electrode disposed within the process chamber.

4. The method of claim 3, wherein the pulsed plasma controls the polymer build-up on the major CD.

5. The method of claim 3, wherein the high-frequency range comprises 3 MHz to 150 MHz.

6. The method of claim 1, wherein the RF source provides modulated bias power in a low-frequency range of 60 Mhz or lower to an electrode disposed within the process chamber.

7. The method of claim 6, wherein the low-frequency range comprises 0.2 MHz to 60 MHz.

8. The method of claim 1, wherein generating the pulsed plasma comprises:
    providing modulated power to a first electrode disposed within the process chamber by periodically turning the RF source on and off according to the duty cycle; and
    providing continuous wave (CW) power to a second electrode disposed within the process chamber while providing the modulated power to the first electrode.

9. The method of claim 1, further comprising selecting or adjusting one or more operational parameters of the plasma processing system to control the polymer build-up on the major CD.

10. The method of claim 9, wherein the one or more operational parameters include at least one of: the duty cycle of the RF source, a power or voltage of the RF source and an etch chemistry supplied to the process chamber to generate the pulsed plasma.

11. The method of claim 10, wherein selecting or adjusting the one or more operational parameters of the plasma processing system comprises:
increasing the duty cycle of the RF source to increase polymer deposition, and/or
decreasing the duty cycle of the RF source to increase sputtering and remove the polymer deposition.

12. The method of claim 11, wherein the pulsed plasma controls the polymer build-up on the major CD.

13. The method of claim 11, wherein the duty cycle is between 20% and 60%.

14. A method for controlling a critical dimension (CD) shrink ratio associated with features formed on a substrate, the method comprising:
forming a patterning layer and one or more underlying layers on the substrate;
generating a pulsed plasma within a process chamber of a plasma processing system by modulating a source power provided by a high-frequency radio frequency (RF) source of 3 MHz or higher to a first electrode disposed within the process chamber according to a duty cycle;
using the pulsed plasma to etch portions of the one or more underlying layers exposed by the patterning layer to form the features on the substrate, wherein the features each have a major CD and a minor CD, the minor CD differing from the major CD; and
controlling the CD shrink ratio associated with the features by selecting or adjusting one or more operational parameters of the plasma processing system to control polymer deposition that occurs on the major CD when etching the portions of the one or more underlying layers.

15. The method of claim 14, wherein the features comprise contacts or vias.

16. The method of claim 14, wherein generating the pulsed plasma comprises:
modulating the source power provided to the first electrode by periodically turning the high-frequency RF source on and off according to the duty cycle; and
providing continuous wave (CW) power to a second electrode disposed within the process chamber while the modulated source power is provided to the first electrode.

17. The method of claim 14, wherein generating the pulsed plasma comprises:
modulating the source power provided to the first electrode by periodically turning the high-frequency RF source on and off according to the duty cycle; and
controlling the CD shrink ratio associated with the features by adjusting the duty cycle.

18. The method of claim 14, wherein the one or more operational parameters include at least one of: a duty cycle of the high-frequency RF source, a power or voltage of the high-frequency RF source and an etch chemistry supplied to the process chamber to generate the pulsed plasma.

19. The method of claim 18, wherein selecting or adjusting the one or more operational parameters of the plasma processing system comprises:
increasing the duty cycle of the high-frequency RF source to increase polymer deposition; or
decreasing the duty cycle of the high-frequency RF source to increase sputtering and remove the polymer deposition.

20. The method of claim 19, wherein the feature is a contact, wherein the one or more operational parameters is the duty cycle of the high-frequency RF source, and wherein the duty cycle of the plasma processing system are selected or adjusted to provide the CD shrink ratio between 0.9 and 1.1.

* * * * *